United States Patent [19]
Delaney et al.

[11] Patent Number: 5,569,944
[45] Date of Patent: Oct. 29, 1996

[54] COMPOUND SEMICONDUCTOR HETEROJUNCTION BIPOLAR TRANSISTOR

[75] Inventors: Joseph B. Delaney, Plano; Timothy S. Henderson, Richardson; Clyde R. Fuller, Plano; Betty S. Mercer, Richardson, all of Tex.

[73] Assignee: Texas Instruments Incorporated, Dallas, Tex.

[21] Appl. No.: 255,282

[22] Filed: Jun. 7, 1994

Related U.S. Application Data

[63] Continuation of Ser. No. 890,887, May 29, 1992, abandoned.

[51] Int. Cl.$^6$ .................................................. H01L 29/737
[52] U.S. Cl. ........................................ 257/198; 257/197
[58] Field of Search .................................. 257/197, 198; 437/133

[56] References Cited

U.S. PATENT DOCUMENTS

| | | | |
|---|---|---|---|
| 3,780,359 | 12/1973 | Dumke | 437/133 |
| 4,954,457 | 9/1990 | Jambotkar | 437/133 |
| 5,073,508 | 12/1991 | Villalon | 437/133 |
| 5,132,764 | 7/1992 | Bayraktaroglu | 257/198 |

FOREIGN PATENT DOCUMENTS

| | | | |
|---|---|---|---|
| 2109360 | 4/1990 | Japan | 257/197 |
| 2-98937 | 4/1990 | Japan | 257/198 |

OTHER PUBLICATIONS

Dubon et al, IEDM 1983 Wash. D.C. "Double Heterojunction . . . Circuits" pp. 689–693.

Primary Examiner—Jerome Jackson
Attorney, Agent, or Firm—Michael K. Skrehot; James C. Kesterson; Richard L. Donaldson

[57] ABSTRACT

Generally, and in one form of the invention a method for making a heterojunction bipolar transistor comprising the steps of forming a compound semiconductor material structure comprised of a plurality of layers, wherein at least one of the plurality of layers is comprised of a first material (e.g. GaAs 36) and at least one of the remaining of the plurality of layers is comprised of a second material (e.g. AlGaAs 32); and etching the layers comprised of the first material with an etchant that does not appreciably etch the layers of the second material is disclosed. A surprising aspect of this invention is that no additional etch stop layer was added in the material structure. Etchants were found that stop on the wide band gap emitter layer (e.g. AlGaAs) usually found in heterojunction bipolar transistors despite the similarity of the materials. An advantage of this method is that a reference point for timing subsequent etches is established at a point other than the top of the uppermost of the layers, thereby improving the accuracy with which the depth of the subsequent etching can be controlled. Improved etch depth accuracy directly relates to more producible and higher yield heterojunction bipolar transistor devices. Other devices, systems, and methods are also disclosed.

17 Claims, 3 Drawing Sheets

COMPOUND SEMICONDUCTOR HETEROJUNCTION BIPOLAR TRANSISTOR

This application is a continuation of application Ser. No. 07/890,887, filed May 29, 1992 abandoned.

FIELD OF THE INVENTION

This invention relates generally to methods for fabricating Heterojunction Bipolar Transistors.

BACKGROUND OF THE INVENTION

Without limiting the scope of the invention, its background is described in connection with compound semiconductor Heterojunction Bipolar Transistors, as an example.

Heretofore in this field Heterojunction Bipolar Transistors (HBTs) have not been widely manufactured in production volumes. Problems with reproducibility and reliability of HBTs in the past have limited the use of the devices in production quantities despite the HBT's advantages of efficiency, power, and linearity over FET devices. Reproducibility in the fabrication of semiconductor devices demands the ability to repeat processes from wafer to wafer and lot to lot. In the case of an epitaxial GaAs HBT, this includes precision in material growth, as well as in selective etching and patterning.

Improvements in HBT fabrication techniques that overcome any or all of the limitations of present techniques are clearly desirable.

SUMMARY OF THE INVENTION

It is herein recognized that a need exists for a method of fabricating Heterojunction Bipolar Transistors that results in a reproducible and reliable device. Specifically, a need exists for a precise technique for the etching or removal of layers in an HBT's material structure. Previous techniques have relied on timed etches referenced to the top of the uppermost layer of the material structure. This technique is not reproducible because of variations in etch concentration and intensity, and material thickness variations that invariably occur in mass production of semiconductor devices. Base layer thicknesses of 500 Angstroms or more have generally been used in HBTs. This base layer is often covered with emitter and emitter contact layers that can be 3000 or 4000 Angstroms thick (the prior emitters have had to be thinner than desired because of etching limitations). Stopping an etch within a precision of approximately 100 Angstroms repeatably after etching 3000 or 4000 Angstroms of two or three material types is an extremely difficult task. Previous techniques have relied on accurately timing a single etch from the top of an epitaxial structure through several layers of material (e.g. GaAs emitter contact and AlGaAs emitter), to a base layer (usually GaAs). The present inventive process takes advantage of the small material difference usually found in the wide band gap emitter of an HBT by using an etchant that etches through a layer (e.g. GaAs), but stops on the wide band gap emitter (e.g. AlGaAs). This eliminates the need for a special etch stop layer within the structure while retaining the benefits of subsequent etch accuracy. The most likely reason that the difference of material has not been previously exploited is the fact that most common etches, both wet and dry, etch GaAs and AlGaAs about equally. It is an important aspect of the present inventive process that etchants herein have been found to etch GaAs, but do not etch AlGaAs. The improvement in etch accuracy when etching through one layer to stop within the base layer, rather than through three or four layers, increases producibility and yield.

Generally, and in one form of the invention a method for making a heterojunction bipolar transistor comprising the steps of forming a compound semiconductor material structure comprised of a plurality of layers, wherein at least one of the plurality of layers is comprised of a first material and at least one of the remaining of the plurality of layers is comprised of a second material; and etching the layers comprised of the first material with an etchant that does not appreciably etch the layers of the second material is disclosed.

An advantage of this method is that a reference point for timing subsequent etches is established at a point other than the top of the uppermost of the layers, thereby improving the accuracy with which the depth of the subsequent etching can be controlled. Improved accuracy of the emitter etch in an HBT process leads to better producibility and higher yields. A further advantage is that combinations of thicker emitter layers and thinner base layers may be used because of the improved accuracy of the inventive etch process. Thick emitter layers enhance the reliability of an HBT by decreasing the chances of emitter contact metallization spiking through the emitter layer to the base layer, while HBTs with thin base layers generally have performance advantages.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

This invention relates to a method of fabricating GaAs Heterojunction Bipolar Transistors (HBTs) and integrated circuits containing these devices, and in particular to a method comprising the process described below.

Figure 1:
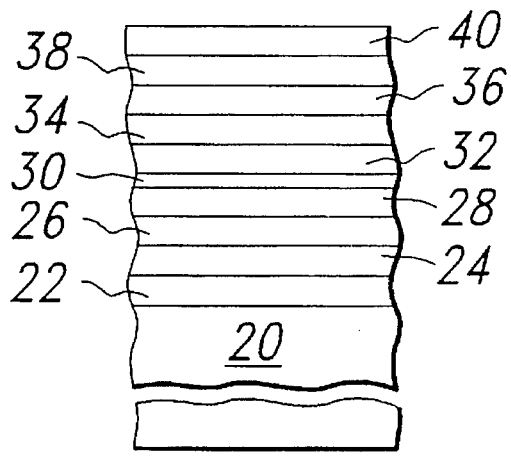
FIG. 1 is an illustration of the epitaxial material structure used in the preferred embodiment fabrication process.

In a specific embodiment of this invention, the epi layers are formed on an approximately 625 μm semi-insulating GaAs substrate 20 by MOCVD, for example, as shown in Table I, and also in illustrated in FIG. 1.

TABLE I

| Film | Thickness μm | Dopant | Doping level atoms/cm³ |
| --- | --- | --- | --- |
| Undoped AlGaAs 22 | 0.3 +/− 0.02 | | <5.0E15 |
| n+ GaAs sub-collector 24 | 1.0 +/− 0.2 | Si | 1.5E18 +/− 0.5E18 |
| n GaAs collector 26 | 0.65 +/− 0.1 | Si | 8.0E15 +/− 1.0E15 |
| p+ GaAs base 28 | 0.05 to 0.1 | C | 1.5E19 +/− 0.5E19 |
| n GaAs 30 | 0.002 | Si | 5.0E17 +/− 1.0E17 |
| n Al$_x$Ga$_{1-x}$As, x = .3 32 | 0.1 +/− 0.01 | Si | 5.0E17 +/− 1.0E17 |
| n Al$_x$Ga$_{1-x}$As, | 0.05 +/− 0.01 | Si | 5.0E17 +/− |

TABLE I-continued

| Film | Thickness μm | Dopant | Doping level atoms/cm$^3$ |
|---|---|---|---|
| x is graded from .3 to 0 34 | | | 1.0E17 |
| n+ GaAs buffer 36 | 0.15 +/− 0.025 | Si | 3.0E18 +/− 0.5 E18 |
| n+ In$_x$Ga$_{1-x}$As, x is graded from 0 to .5 38 | 0.02 to 0.05 | Si | 0.3E19 to 1.0E19 |
| n+ In$_x$Ga$_{1-x}$As, x = .5 40 | 0.02 to 0.05 | Si | 1.0E19 |

Figure 2:
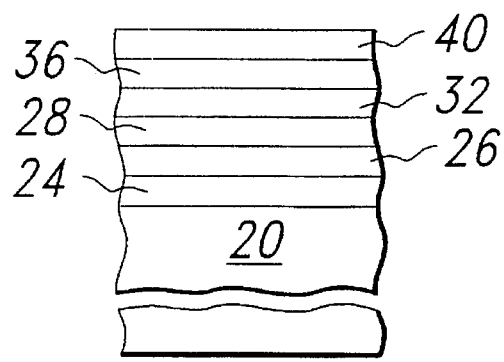
FIG. 2 is a simplified illustration of the epitaxial material structure used in the preferred embodiment fabrication process.

The InGaAs layers are made with dopant concentration as high as possible. The values given are those thus far obtained. The devices have been fabricated with and without these layers. With these layers, emitter contact has been made with non-alloyed Ti—Pt—Au with minimized risk of contact metal spiking through to the base layer 28. Without the InGaAs, alloyed AuGe/Ni/Au emitter contacts are necessary. A simplified illustration of FIG. 1, shown in FIG. 2, will be used in subsequent discussions of the inventive process.

Another preferred embodiment material structure omits the use of InGaAs layers 38 and 40, and instead uses a much thicker (approximately 4750 Angstroms) GaAs layer 36. A thicker GaAs layer allows the use of alloyed AuGe/Ni/Au emitter contacts with less danger of contact metal spiking through the GaAs than would be the case with a thin GaAs layer 36.

1. Epitaxial layer thicknesses are defined to enhance manufacturability and subsequent device reliability. For example, if the emitter region is made to be 5000 Angstroms or greater, good reliability is obtained with conventional AuGe/Ni/Au or Pd(Pt)Ge contacts. Use of a highly doped InGaAs surface layer permits use of a refractory metal or metal silicide emitter contact, virtually eliminating failure from spiking of gold base metallizations.

2. Masking for selective deep implant isolation (O$_2$ at ~5 eV) is provided by use of an easily removable, thickly plated, Au film. Alternatively, the isolation implant may be delayed until after the base etch and done by using B at 200 to 700 eV.

Figure 3:
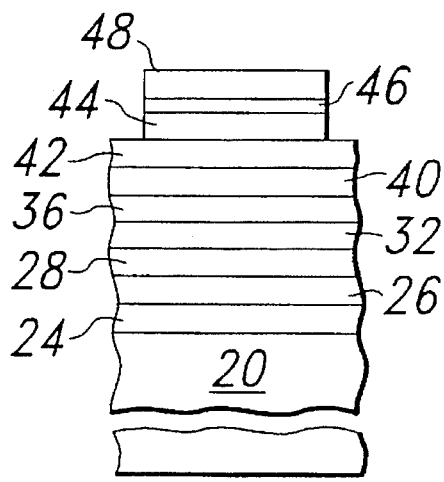
FIGS. 3–12 are illustrations of the material structure at various steps in the preferred embodiment process.

In a specific embodiment of this invention, implant masking is produced as follows:

a. After epi layers are formed, alignment marks are generated in the wafer, and a 1.3 μm layer of photoresist 44 is spun onto the wafer and baked to 140° C. for 30 minutes. In another specific embodiment of the process, a barrier/contact layer 42 is applied over the epi structure. This is discussed in detail in (3) below.

b. TiW—Au (100–200 Angstroms) 46 is sputtered over the resist to act as a plating base for the electroplated Au 48 which is the primary implant mask.

c. A second photoresist coat (not shown) is spun over the sputtered TiW—Au layer, and the isolation pattern is aligned, exposed and developed into this resist layer. Exposure, pre-develop bake, and develop are optimized to ensure vertical sidewall patterns.

d. Au 48 is electrodeposited onto the sputtered Au in the patterns provided by the photoresist (not shown), to a thickness of 4 μm.

e. The plating pattern resist is removed in a scrubber, then rinsed with water spray. The exposed sputtered TiW—Au layer 46 is removed by ion milling, using the plated Au 48 as a mask.

f. The resist layer 44 beneath the sputtered TiW—Au 46 plated with Au 48 is RIE etched in O$_2$, again using the plated Au 48 as a mask, to ensure resist edges are coincident with the plated Au 48 pattern. An illustration of the structure at this point is shown in FIG. 3.

The wafer is now ready for isolation implant. In a specific embodiment of this invention, the implant schedule is as shown in Table II.

TABLE II

| Species | Energy, MeV | Dose |
|---|---|---|
| O+ | 0.25 | 8.0 E11 |
| O+ | 0.50 | 1.0 E12 |
| O+ | 1.50 | 1.0 E12 |
| O+ | 2.50 | 1.0 E12 |
| O+ | 3.70 | 1.0 E12 |
| O+ | 5.10 | 1.0 E12 |
| Ga | 0.60 | 1.0 E12 |
| Ga | 1.10 | 1.0 E12 |
| B | 0.05 | 1.5 E12 |
| B | 0.16 | 2.0 E12 |
| B | 0.30 | 3.0 E12 |

Figure 4:
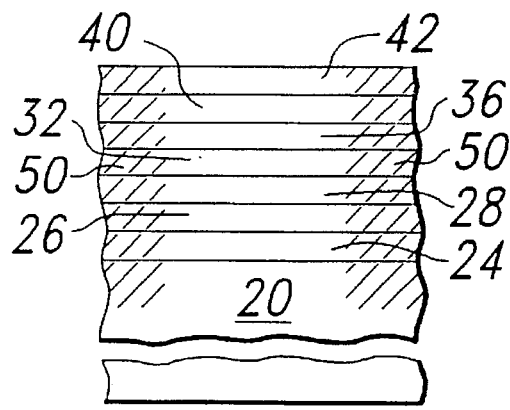

The implant masking material is then removed in acetone. The wafer is now ready for device processing. Isolation is complete from the surface well into the semi-insulating substrate. An illustration of the material structure at this point is shown in FIG. 4. Areas affected by isolation implant 50 are shown shaded.

3. Emitter contacts are provided by refractory metal, refractory metal nitride, or refractory metal silicide contacts to highly doped InGaAs, giving low resistance contacts stable to high operation or storage temperatures.

This barrier/contact layer can be a number of different film compositions. It is used to keep Ti from reacting with the InGaAs contact layer and causing a damaging increase in emitter contact resistance. Pure W can be used, but deposition conditions providing low stress must be employed. TiW, sputtered in an Ar+6+/−4% N$_2$ such that the available Ti at the interface is present as TiN, may also be used.

The preferred method of this invention is to use a 2000 Angstrom layer of W$_5$Si$_3$ 42, DC magnetron sputtered at 5 milliterr and 1.5 kW. The W$_5$Si$_3$ thickness may vary from about 500 to 3000 Angstroms. Thicker films are stronger and better at resisting tensile stresses resulting from thermal coefficient of expansion differences between this barrier/contact layer and the more conductive Au based metallization deposited on top of the W$_5$Si$_3$ layer.

By increasing Ar pressure to the range of 20 +/31 5 millitorr, the W$_5$Si$_3$ film can be deposited with tensile stress, improving adhesion to the InGaAs and increasing resistance to stress failure at elevated temperatures.

4. The emitter geometry may be formed by lift off techniques in which the emitter pattern is formed as openings in a photoresist film. This is accomplished with the use of image reversal photoresist. In a specific embodiment, adhesion promoter is spun over the W$_5$Si$_3$ coated wafers. Photoresist is then spun to a thickness of approximately 1.8 μm followed by a track bake at 90° C. for 90 seconds. The wafers are then blanket exposed at 365 nm for 0.7 seconds, track baked at 125° C. for 50 seconds, exposed in a stepper, and batch developed in a solution of 1:1 developer:H$_2$O for 6 minutes. The exact conditions will vary with resist batch, as bakes, blanket expose, pattern expose, and develop times for optimum resist sidewall profile will change with resist batch.

5. Following the formation of the image reversal lift off photoresist pattern, the wafers are ashed to remove resist or other organic residues in the pattern, dipped in Bell #2 to remove surface oxides, rinsed and spin rinse dried. Au based emitter metallization is evaporated onto the wafer, depositing through the opening in the photoresist onto the previously deposited refractory metal or metal silicide contact layer 42. The photoresist is then "lifted off" by attacking it with a solvent at patterned region sidewalls not covered by the evaporated metal. Because the wafer surface is entirely covered with metal ($W_5Si_3$) 42 prior to the evaporation, the radiant energy from the metal evaporation source will be more efficiently collected than when the wafer is bare GaAs. Evaporation over bare GaAs can result in excessive heating of the photoresist, altering the profile such that evaporated metal deposits on the sidewall of the emitter patterns produce unwanted "wings", or metal tags, that can cause emitter-base shorts.

In a specific embodiment of this invention, the emitter metal is deposited by electron beam evaporation. This Au based metal system consists of: Ti/Pt/Au, in thicknesses of 450/400/3800 Angstroms, respectively. To ensure minimum heating during this evaporation, the Ti rise, soak, and predeposition times are set at 5 seconds each. This permits the Ti to be ready to be evaporated when the system shutter opens without spending excessive time at each of these processes, resulting in much less damage to the resist profile from radiant heating during evaporation of the Ti. For similar reasons, Pt rise, soak, and predeposition times are set at 5, 5, and 15 seconds, respectively.

Figure 5:
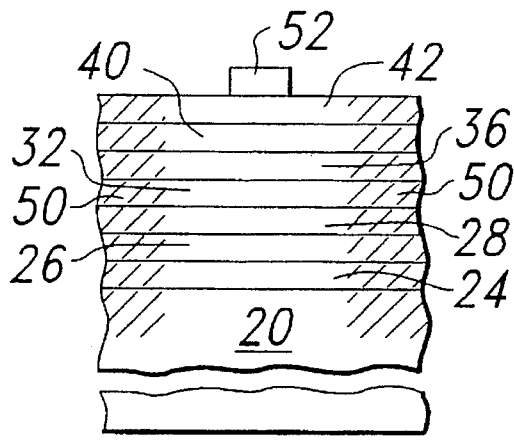

Following evaporation, the photoresist is lifted off in solvent. Typically, acetone is employed with soaks, ultrasonic agitation, or spraying while the wafer is spun. While the details of the lift-off process can adversely affect the patterning results, any process that leaves a debris free surface will work. An illustration of the structure at this point is shown in FIG. 5.

The resulting patterned TiPtAu 52 is used as a mask to etch the emitter geometry.

6. An alternative method of forming the emitter geometry involves sputtering TiW—Au over the sputtered refractory metal or metal silicide contact/barrier layer, spinning photoresist, exposing and developing the pattern, and then pattern etching the TiW—Au to form the emitter metal geometry and serve as a pattern mask for the Reactive Ion etching of the $W_5Si_3$ InGaAs, GaAs, and AlGaAs layers forming the emitter structure. The advantages of this process are many and include the following:

a. Intrinsic stress in the refractory barrier film can be controlled over a range from $5.0 \times 10^{10}$ compressive to $5.0 \times 10^{10}$ tensile dynes/cm$^2$ by varying the sputter deposition pressure. Thus, the structural integrity of the $W_5Si_3$/TiW/Au, for example, sandwich can be enhanced by determining the stress in the $W_5Si_3$ film, then choosing deposition conditions for the TiW—Au to provide balancing stresses. In practice, we find that a composite film stress at room temperature, of about $2 \times 10^9$ dynes/cm$^2$ tensile is nearly ideal. By being mildly tensile, the metal films, with thermal coefficient of expansions higher than that of the device substrate, will provide stress relief as temperature is increased.

b. The use of pattern etching instead of lift-off leaves a cleaner edge to the pattern without the possibility of emitter-base shorting metal tags that can occur from metal deposition onto lift-off resist pattern sidewalls.

In a preferred embodiment of this invention, the $W_5Si_3$ layer is deposited as described in (3) above. The deposition is characterized for intrinsic stress in that layer. Stress characterization is required since for a given deposition system, the stress may vary. Then the system is characterized for deposition of a TiW/Au/TiW film with stresses such that the composite stress of the $W_5Si_3$/TiW/Au/TiW film is slightly tensile with a value of approximately $2 \times 10^9$ dynes/cm$^2$. This will typically occur with a TiW deposition pressure of 15+/−5 millitorr, but exact pressures will depend on the stress in the $W_5Si_3$ film and the accuracy of the sputter system pressure measuring device. The thicknesses of the TiW/Au/TiW layers are, for example, 1500, 4000, and 400 Angstroms, respectively. The top TiW layer serves the purpose of acting as an indicator for completion of a subsequent via etch through a planarizing dielectric to the Au layer. These thicknesses are nominal, and different thicknesses may be employed within the scope of this invention. In an alternative embodiment, stress can be controlled in the $W_5Si_3$ film itself, eliminating the need for stress relief layers. This is accomplished by depositing the film by DC magnetron sputtering with power of 1000–2000 W and under pressure of 15–20 millitorr.

7. An alternative method of achieving the emitter geometry with controlled stress at the $W_5Si_3$ interface is to combine sputter deposition of TiW over the $W_5Si_3$ with lift-off patterning of evaporated Ti—Pt—Au. Again, the deposition pressure for a 2000+/−500 Angstroms TiW film will be in the range of 15+/−5 millitorr. The lift-off and Ti—Pt—Au evaporation processes are as described in (4) above.

8. Stress in the $W_5Si_3$ film can be controlled to desirable lightly tensile (2+/−1 $\times 10^9$ dynes/cm$^2$ for a 1000 Angstrom film) by DC magnetron sputter depositing in Ar at pressures in the range of 20+/−5 milliterr and 1.5+/−0.5 kW. Exact deposition conditions must be determined for a given sputter system by performing a stress vs. deposition pressure matrix. Actual emitter geometry can be formed by any of the techniques described in (5) through (7) above.

Figure 6:
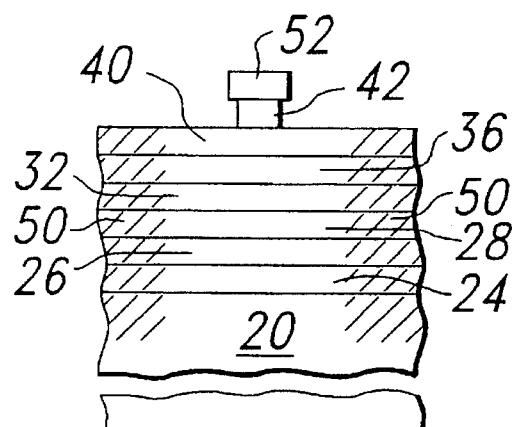
Figure 7:
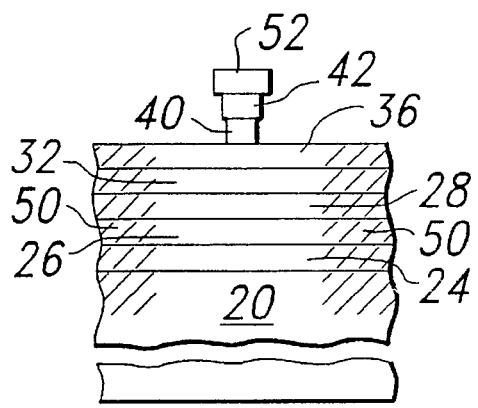
Figure 8:
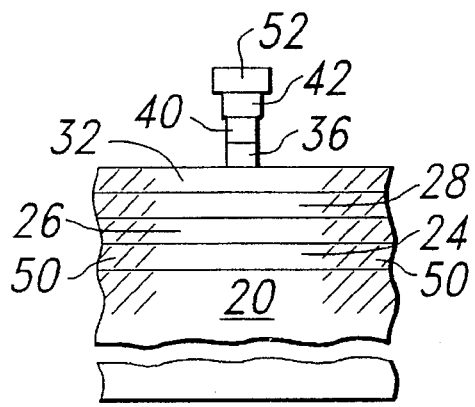

9. In order to form the emitter mesa of the transistor, a selective RIE process is employed to etch through the $W_5Si_3$ 42 or $W_5Si_3$/TiW, stopping on the InGaAs 40 surface. The resulting structure is shown in FIG. 6. The InGaAs 40 is etched in a non selective, timed, wet etch which results in the structure of FIG. 7. The GaAs buffer 36 is etched in a Reactive Ion Etch process that stops on the AlGaAs layer 32, giving a positive reference for etching the balance of the emitter region in a controlled rate, controlled undercutting, timed RIE etch permitting precise control for stopping safely in the 500 to 1000 angstrom thick p+ GaAs base region 28. For example, the InGaAs layer 40 is wet etched for a sufficient time to clear and etch into the GaAs buffer 36. The GaAs is RIE etched in a gas mixture that will not etch AlGaAs, and thus the etch steps on the AlGaAs layer 32. The distance to the thin p+ base region 28 is now precisely known. Without the selectivity of the initial RIE etch with respect to AlGaAs, costly and inaccurate step height measurements would be required after the InGaAs wet and GaAs RIE etch to ensure etching into but not through the base region 28. An illustration of the structure, etched to the top of the AlGaAs layer, is shown in FIG. 8.

In a specific embodiment of this invention, wafers processed through steps as described in (5) through (8) above, are rigorously cleaned, with a final plasma ash step to ensure that the edges of the TiW—Au or T-Pt—Au emitter contact patterns are clean and free of debris, and the surface of the unetched $W_5Si_3$ or TiW is free of any possible etch masking contaminant. The final plasma ash, which may be performed in either a radio frequency plasma reactor or in a microwave frequency down stream reactor in $O_2$, $O_2$:He, or $O_2$:$N_2O$, or similar gas mixtures, is an absolutely critical last step prior to RIE etching of the $W_5Si_3$ contact.

ASH

In a preferred embodiment of this invention, after the wafers receive final steps in the solvent lift-off to form the emitter geometry pattern in Ti—Pt—Au metallization, any organic residues are removed by ashing in a downstream asher. The process is performed at 150° C. for 5 minutes at 400 watts and 4 torr. Gas flows are: 6 slm $O_2$, 1 slm $N_2O$.

$W_5Si_3$ RIE ETCH

The wafers are immediately placed in an RIE. The refractory metal 42 is etched in $CF_4$+8% $O_2$ @250 watts, 30 millitorr, 40° C. to a visible clearing of the metal layer 42 +50% over-etch. The etch stops on the InGaAs and undercuts the $W_5Si_3$ layer by about 1500 angstroms or less.

InGaAs WET ETCH

Following RIE of the $W_5Si_3$ 42, the wafers are lightly cleaned through a water spin-rinse dry. The InGaAs layer 40 is then removed in a 1:8:160 solution of $H_2SO_4$:$H_2O_2$:$H_2O$ for 25 seconds. The solution is mixed fresh, and allowed to age for 30 minutes prior to using to establish a repeatable etch rate for the process. The wafers are rinsed in flowing deionized water, then spin-rinsed and dried.

ETCH TO AlGaAs

To ensure removal of any masking organic residue, the wafers are ashed 5 minutes @150 watts, 900 millitorr in a barrel type asher, etched 30 seconds in 40:1 $NH_4OH$, rinsed in flowing deionized water, then spin-rinsed and dried prior to placing into the RIE for etch to AlGaAs 32. No more than 30 minutes is allowed between the etch rinse and placing into the reactor. The wafers are RIE etched @80° C., 200 watts, 95 mt in gas flows of: 4.5% $H_2$ in He, 20 sccm; $CCl_4$, 10 sccm. Etch rate is approximately 350 angstroms/minute, and is timed to etch to the graded AlGaAs layer 32 with about 50% over etch. The timing is not critical since the etch does not attack the AlGaAs layer 32. Further, since the etch depth is exactly to the graded AlGaAs layer 32 surface, remaining etch depth to the approximately 1000 angstrom thick p+ base region 28 is precisely known from the original HBT epitaxial structure. As a check on the process and to serve as a reference for the next and more critical etch to base step, etch step heights are measured at 5 positions on the wafers. This step height results from the composite thickness of the metal 42, InGaAs 40, and GaAs 36 layers above the graded AlGaAs 32. In another preferred embodiment of this process step, $BCl_3$+$SF_6$ may be substituted for $CCl_4$. The $SF_6$ keeps $BCl_3$ from etching AlGaAs, which it would otherwise. Surprisingly, it appears that a variety of etchants fulfill the requirements of etching GaAs, but stopping on AlGaAs. $CCl_4$ is just one gas in the group that includes Chlorocarbons and Chlorofluorocarbons that, when used in a RIE arrangement, etches GaAs, but stops on AlGaAs. Additionally, it appears that non-Ar Cl-based gases in general, of which $BCl_3$ is one, when used with a source of F, like SFs, will also perform the required etch. The non-Containing etches also avoid the problems associated with Chlorocarbons and Chlorofluorocarbons such as damage to the earth's ozone layer.

$BCl_3$:$Cl_2$ BASE ETCH

A non-selective, reproducible etch rate $BCl_3$+$Cl_2$ RIE etch process may now be used to etch to clear and safely stop in the necessarily thin p+ base region 28. However, Cl will remain from the etch and can cause corrosion of the Au contact under bias conditions. This Cl can be removed by exposure to rf plasma in $CF_4$. Pilot wafers are etched to verify and recalibrate etch rate in the reactor prior to etching the device wafers. In a preferred embodiment of this invention, the etch to base process is performed as follows:

a. The wafers are etched 30 seconds in 40:1 $NH_4OH$, rinsed in flowing deionized water, then spin-rinsed and dried. No more than 30 minutes is allowed between the etch, rinse and placing into the reactor.

b. Wafers are loaded into the AME 1830. Gas flows ($BCl_3$ @200 sccm, 4% $H_2$ in He @30 sccm, and $Cl_2$ @8 sccm) are established at 50 millitorr. Wafers are RIE etched, by time established in etch rate determination and etch distance to base 28, in those gasses @a dc bias of –45 v. A probe for surface breakdown is employed for verification of etch to base 28.

Figure 9:
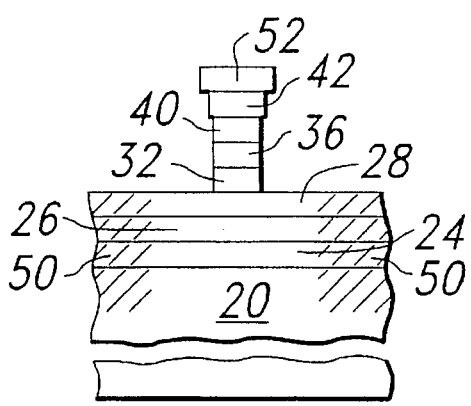

10. The total etch process (through the $W_5Si_3$ 42 to the p+ base 28) results in undercutting the emitter contact pattern such that overhang of the $W_5Si_3$—Ti—Pt—Au emitter geometry pattern shadows emitter mesa side walls, as shown in FIG. 9, permitting self aligned base contacts with normal incidence evaporation. If non self-aligned base contacts are used, the emitter mesa undercut ensures that close placement misalignment cannot result in emitter-base shorting.

Figure 10:
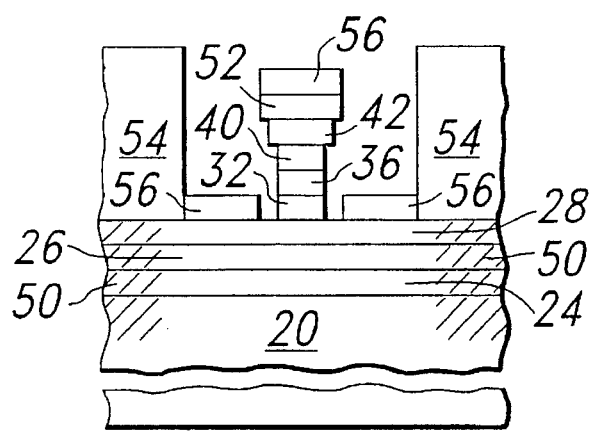

In a preferred embodiment of this invention, with emitter self or optically aligned base contacts, a reverse image photoresist 54 pattern is made with a process similar to that described for the lift off patterned emitter contact geometry. With either optically or self aligned base contacts, the process is the same. The photoresist 54 patterns differ. Ti—Pt—Au films, in thicknesses of 500, 250, and 1500 Angstroms 56 are sequentially evaporated and lifted off. Film thicknesses are deliberately low to ensure that with close to emitter placement, or with self alignment, the top of the base contact will be safely below the emitter metal. Post lift-off clean-ups are essentially the same as with the emitter Ti—Pt—Au process. The structure, with base contacts, is shown in FIG. 10.

Figure 11:
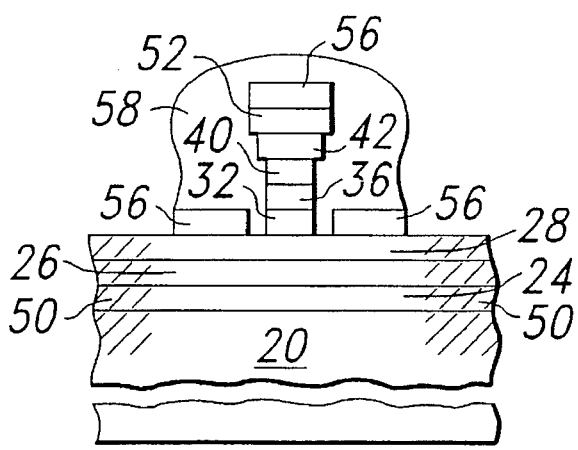

11. A base mesa, defined in positive photoresist 58 sized so the edges of base mesa resist pattern are essentially coincident with edges of the base contacts 56, is etched through the base 28 to the collector region 26 to minimize base collector capacitance. The base mesa etch process is essentially identical to the base etch, except the time is set to correspond to the base layer 28 thickness plus about 1000 Angstroms. FIG. 11 is an illustration showing the photoresist 58 that defines the base mesa.

Figure 12:
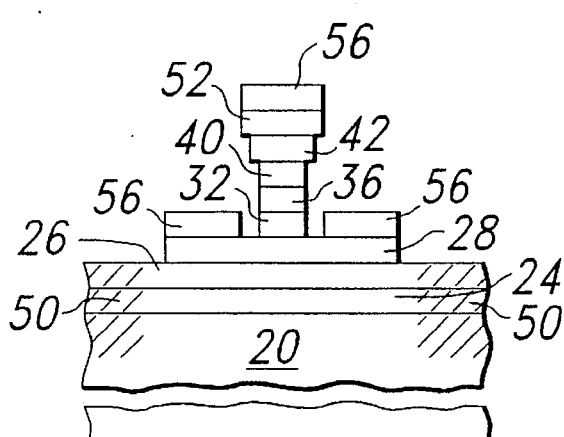

In a specific embodiment of this invention, the wafers are etched 30 seconds in 40:1 $H_2O$:$NH_4OH$, rinsed in flowing deionized water, and spin rinse dried. Adhesion promotor is applied, and positive photoresist is spun on, baked, aligned, exposed, developed, ashed 3 minutes @150 watts, 900 millitorr in a barrel type asher, and baked 30 minutes @100° C. The wafers are again ashed 3 minutes @150 watts, 900 mt in a barrel type asher. At this point, the resist thickness is measured to serve as a rough base line for determining etch depth. The wafers are then dipped 10 seconds in Bell #2 to remove native oxides, rinsed in flowing deionized water, and spin rinse dried. The wafers are then etched as with the AlGaAs portion of the base etch. Time is set from etch rate determination to remove approximately 2000 angstroms. Proper etch depth is verified both with a step height measurement and a probe for surface breakdown. Wafers are blanket exposed at 365 nm to soften the photoresist. The resist is then removed by Acetone spray and a 5 minute ash in an MTI Afterglo downstream asher @150° C., 400 watts in gas flows of 6 slm $O_2$ and 1 slm $N_2O$, at 4 torr. Particulate contamination is then removed in a water high pressure spray scrub. Wafers are now ready for the collector etch step. The resulting structure is shown in FIG. 12.

12. Collector contact regions are etched through the remaining n– 26 to the n+ subcollector 24 employing positive photoresist masking and the moderately undercutting etch described for both base and base mesa etch. The photoresist, slightly undercut by the $BCl_3$:$Cl_2$ RIE, is left in place as a lift-off mask for collector contact evaporation 60. AuGe/Ni/Au contact metallization is evaporated over the wafer, and solvent lift-off, attacking the photoresist at the underside of the overhang left by the collector etch undercut, is employed to remove the resist and the excess metal. Wafers are then ashed to remove the final organic residues.

Figure 13:
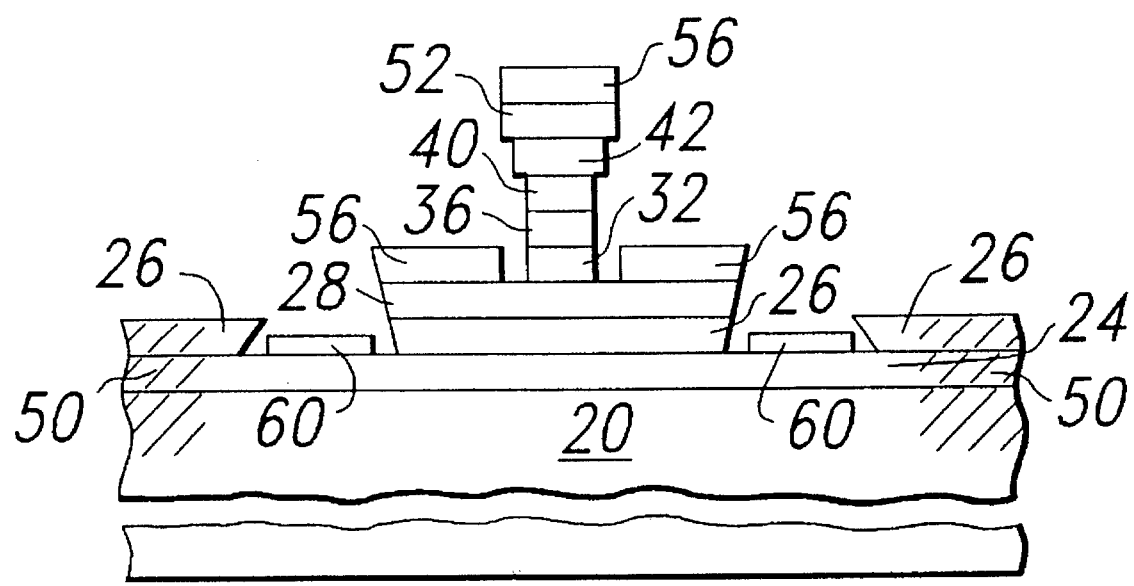

In a specific embodiment of this invention, the wafers are etched 30 seconds in 40:1 $H_2O$:$NH_4OH$, rinsed in flowing deionized water, and spin rinse dried. Adhesion promotor is applied, and positive photoresist is spun on, baked, aligned, exposed, developed, ashed 3 minutes @150 watts, 900 millitorr in a barrel type asher, and baked 30 minutes @100° C. The wafers are again ashed 3 minutes @150 watts, 900 mt in a barrel type asher. At this point, the resist thickness is measured to serve as a rough base line for determining etch depth. The wafers are then dipped 10 seconds in Bell #2 to remove native oxides, rinsed in flowing deionized water, and spin rinse dried. The wafers are then etched as with the AlGaAs portion of the base etch. Time is set from etch rate determination to remove approximately 7700 angstroms. Proper etch depth is verified both with a step height measurement and a probe for surface breakdown. Wafers are then ashed 1 minute @150 watts, 900 mt in a barrel type asher, etch cleaned 10 seconds in 1:8:160 ($H_2SO_4$:$H_2O_2$:$H_2O$) to remove etch damage, rinsed in flowing deionized water, spin rinsed and dried. AuGe-Ni—Au contact metallization is evaporated over the surface of the photoresist and into the etched collector contact regions. Photoresist undercut, occurring during the $BCl_3$/$Cl_2$ RIE, provides necessary edge shadowing to prevent metal continuity over resist sidewalls to collector contacts, thus permitting resist liftoff patterning of the collector contact. Resist and excess metal are removed by solvent liftoff, and ashed 5 minutes @150 watts, 900 millitorr in a barrel type asher to remove organic residues. The resulting structure is shown in FIG. 13.

13. Electrical contacts and interconnections are made to emitter, base and collector regions. Interconnects are brought into these regions through vias in partially planarized dielectrics, ensuring that substrate leaks are eliminated, and resulting in devices which operate with higher efficiency and markedly lower power drain.

In a specific embodiment of this invention, the partially planarized dielectric film is formed as follows:

a. Following the ash step above, wafers are plasma pre-treated at 15 W, 50° C., and 260 millitorr in a gas mixture of Freon 13B1 and $CF_4$+8% $O_2$ to enhance $Si_3N_4$ adhesion and reduce plasma induced damage from nitride and oxide deposition.

b. A dielectric film consisting of 1000 Angstroms $Si_3N_4$ followed by 10000 Angstroms $SiO_2$ is plasma deposited in a parallel plate reactor onto the wafers.

Conditions for nitride deposition are:

Gas: 260 sccm 10% $NH_3$ in Ar, 540 sccm 5% $SiH_4$ in Ar, 850 sccm $N_2$

System pressure: 1000 millitorr

Deposition power: 40 Watts

Upper plate temperature: 40° C.

Lower plate temperature: 250° C.

Conditions for oxide deposition are:

Gas: 540 sccm 5% $SiH_4$ in Ar, 650 sccm $N_2$

System pressure: 650 millitorr

Deposition power: 30 Watts

Upper plate temperature: 40° C.

Lower plate temperature: 250° C.

$Si_3N_4$ seals in the device surfaces and provides good adhesion to GaAs and Au layers. $SiO_2$ provides good insulation, good etch rate differential for plasma etchable interconnects or resistors, and good faceting for planarization sloping by ion milling or sputter etching.

c. The wafers are ion milled at near normal incidence to remove 5000 Angstroms. Essentially vertical oxide side walls are sloped at roughly 45 degrees by this etch. If sputter etching is employed instead of ion milling, the same degree of sidewall sloping can be achieved with removal of 1750+/–250 Angstroms. Initial oxide thickness should be reduced to approximately 7000 Angstroms if sputter etch is used instead of ion milling to slope oxide side walls. Side wall sloping is to ensure good lead thickness for interconnect over the elevated emitter and base and depressed collector topography.

d. Wafers are scrubbed in adhesion promotor high pressure spray and returned to the nitride/oxide deposition reactor for a 2000 Angstrom oxide deposition, making the oxide thickness over emitter, base, and collector contacts approximately 7000 Angstroms.

14. Ballast resistors, TaN process.

Base and emitter ballast resistors are provided to prevent local high current hot spots and resulting thermal runaway. A scheme is given to provide pattern etched TaN (50 ohms/square) resistors from less than 10 to greater than 600 ohms on the same lithography level. Use of TaN resistors over $SiO_2$ dielectric permits accurate geometry formation with plasma or RIE of the resistors with a good etch stop.

·15. Emitter leads are made resistant to electromigration at high current densities by expanding them over partially planarized insulation over base leads, and by making them in multiple layers with barrier metals sandwiched between Au conductor layers.

16. A second level interconnect, fully compatible with Au airbridge technology, allows easy integration of power transistors with low noise, low power logic transistors, thus permitting fabrication of logic, transmitter, and receiver circuits on the same chip, meeting digital telecommunications requirements.

17. The use of contact via connection to emitter, base, and collector regions, and the etching of base mesa, means that unique devices, such as a GaAs SCR are made possible.

18. Not only are conventional circuit components, including parallel plate capacitors, and load resistors provided in this fabrication scheme, but up to 6 µm thick power busses and transmission lines are possible. This allows for lower circuit losses and permits shrinking geometries of passive components.

A few preferred embodiment processes have been described in detail hereinabove. It is to be understood that the scope of the invention also comprehends embodiments different from that described, yet within the scope of the claims.

Internal and external connections can be ohmic, capacitive, direct or indirect, via intervening circuits or otherwise. Implementation is contemplated in discrete components or fully integrated circuits in gallium arsenide, and other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A heterojunction bipolar transistor comprising:

a compound semiconductor material structure comprising a plurality of layers, wherein at least one of said plurality of layers is composed of a first material and at least one of the remaining of said plurality of layers is composed of a second material;

a mesa on a layer of a third material, said third material doped a conductivity type opposite that of said first and second materials, said mesa comprising a first layer of said first material atop a layer of said second material, said layer of first material serving as a buffer layer between a contact layer atop said first layer of material and said second layer of material, and wherein said first layer has a thickness greater than 4000 Å and said second layer has a thickness less than that of said first layer; and a contact on said layer of third material and adjacent said mesa.

2. The heterojunction bipolar transistor of claim 1 whereto said first and second materials comprise a compound semiconductor selected from a group consisting of GaAs and AlGaAs.

3. The heterojunction bipolar transistor of claim 1 wherein said first material is GaAs.

4. The heterojunction bipolar transistor of claim 1 wherein said second material is AlGaAs.

5. The heterojunction bipolar transistor of claim 1 wherein said contact layer comprises Au.

6. A heterojunction bipolar transistor comprising an emitter mesa on a base layer, said emitter mesa comprising:

an emitter layer;

a buffer layer atop said emitter layer, said buffer layer having a thickness of greater than 4000 Å and said emitter layer having a thickness less than that of said buffer layer; and a contact on said base layer adjacent said mesa.

7. The transistor of claim 6 further comprising layers of AuGe, Ni, and Au atop said buffer layer.

8. The transistor of claim 6 further comprising a layer comprising Pd and Ge atop said buffer layer.

9. The transistor of claim 6 further comprising a layer comprising Pt and Ge atop said buffer layer.

10. The heterojunction bipolar transistor of claim 6 whereto said emitter and buffer layers are composed of materials selected from a group consisting of GaAs and AlGaAs.

11. The heterojunction bipolar transistor of claim 6 wherein said buffer layer is composed of GaAs.

12. The heterojunction bipolar transistor of claim 6 wherein said emitter layer is composed of AlGaAs.

13. The heterojunction bipolar transistor of claim 6 further comprising a base layer adjacent said emitter layer, said base layer having a thickness of less than approximately 1000 Å.

14. A heterojunction bipolar transistor comprising:

an emitter mesa on a base layer, said emitter mesa comprising:

an AlGaAs emitter layer;

a GaAs buffer layer atop said emitter layer, said buffer layer having a thickness greater than 4000 Å and said emitter layer having a thickness less than that of said buffer layer: and an emitter contact atop said buffer layer, said contact comprising a layer of Au; and a base contact on said base layer and adjacent said emitter mesa.

15. The transistor of claim 14 further comprising a base layer adjacent said emitter layer, said base layer having a thickness of less than approximately 1000 Å.

16. The transistor of claim 14 wherein said buffer layer has a thickness of approximately 4750 Å.

17. The transistor of claim 14 wherein said contact further comprises a layer of AuGe and a layer of Ni.

* * * * *